(12) United States Patent
Kabir

(10) Patent No.: US 11,397,695 B2
(45) Date of Patent: Jul. 26, 2022

(54) CONFIGURABLE MEMORY TERMINATION

(71) Applicant: Micron Technology, Inc., Boise, ID (US)

(72) Inventor: Mohammad Ehsan Kabir, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/660,745

(22) Filed: Oct. 22, 2019

(65) Prior Publication Data

US 2021/0117346 A1 Apr. 22, 2021

(51) Int. Cl.
*G06F 13/16* (2006.01)
*G06F 13/40* (2006.01)
*G11C 11/4093* (2006.01)

(52) U.S. Cl.
CPC ...... *G06F 13/1668* (2013.01); *G06F 13/4086* (2013.01); *G11C 11/4093* (2013.01)

(58) Field of Classification Search
CPC .... G06F 13/362; G06F 13/4282; H04W 8/24; G11C 11/4093
See application file for complete search history.

(56) References Cited

U.S. PATENT DOCUMENTS

| | | | |
|---|---|---|---|
| 7,034,565 B2* | 4/2006 | Lee | G11C 7/1051 326/26 |
| 2008/0147934 A1* | 6/2008 | Nonaka | G06F 3/067 710/74 |
| 2009/0265584 A1* | 10/2009 | Kawakami | G06F 11/0727 714/43 |
| 2013/0182513 A1* | 7/2013 | Eom | H03K 19/0005 365/189.07 |
| 2013/0223123 A1* | 8/2013 | Lee | G11C 7/1084 365/63 |
| 2018/0137005 A1* | 5/2018 | Wu | G11C 11/4093 |
| 2019/0043571 A1* | 2/2019 | Damle | G11C 13/004 |
| 2019/0259429 A1* | 8/2019 | Heo | G11C 11/4074 |
| 2019/0362763 A1* | 11/2019 | Lee | G06F 3/0673 |

* cited by examiner

*Primary Examiner* — Henry Tsai
*Assistant Examiner* — Christopher A Daley
(74) *Attorney, Agent, or Firm* — Holland & Hart LLP

(57) ABSTRACT

Methods, systems, and devices for configurable memory termination are described. In one example, a memory system, such as a memory module or a memory assembly, may include one or more memory devices (e.g., memory arrays, memory chips), and an input/output circuit coupled with the one or more memory devices and for communicating over a channel. The memory system may also include a selection component operable to selectively isolate the input/output circuit from one or more signal paths of the channel based at least in part on receiving a signal from a host device. In some examples, the selection component may be operable to selectively couple the one or more signal paths of the channel with one or more termination resistance elements.

20 Claims, 7 Drawing Sheets

CONFIGURABLE MEMORY TERMINATION

BACKGROUND

The following relates generally to a system that includes at least one memory device and more specifically to configurable memory device termination.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

Some systems may include a host device in electronic communication with a set of memory systems (e.g., memory modules, memory assemblies) over a common channel, such as a common data channel.

DETAILED DESCRIPTION

Some systems that include memory devices for information storage may include a host device in electronic communication with a set of memory systems (e.g., memory modules, memory assemblies) over a common channel, such as a data channel. In some cases, components or circuitry of one memory system coupled with the common channel may cause degradation or attenuation of signaling associated with another memory system coupled with the common channel. For example, reflections of signals from a first memory system coupled with the common channel may interfere with communications between the host device and a second memory system coupled with the common channel (e.g., causing a noise component on the channel, reducing signal-to-noise ratio on the channel, or otherwise degrading or attenuating communications on the channel). Such degradation or attenuation may be associated with data access errors, reduced margins for performing data access operations, or other adverse effects.

In accordance with aspects of the present disclosure, a memory system may include one or more memory devices (e.g., memory arrays, memory chips), and an input/output circuit (e.g., of or associated with the one or more memory devices) for communicating with a host device over a channel. The memory system may also include a selection component operable to selectively isolate or disconnect the input/output circuit from one or more signal paths of the channel based at least in part on receiving a signal from the host device (e.g., a deactivation signal, an idling signal). In some examples, the selection component may be operable to selectively connect or couple the one or more signal paths of the channel with one or more termination resistance elements. In other words, memory systems in accordance with the present disclosure may include configurable terminations, which may be responsive to signaling from a host device. By isolating the input/output circuit of a memory system from one or more signal paths of such a channel, degradation or attenuation of signals that might otherwise be caused by input/output circuitry of the memory system, or related signal paths, may be reduced or eliminated.

Figure 1:
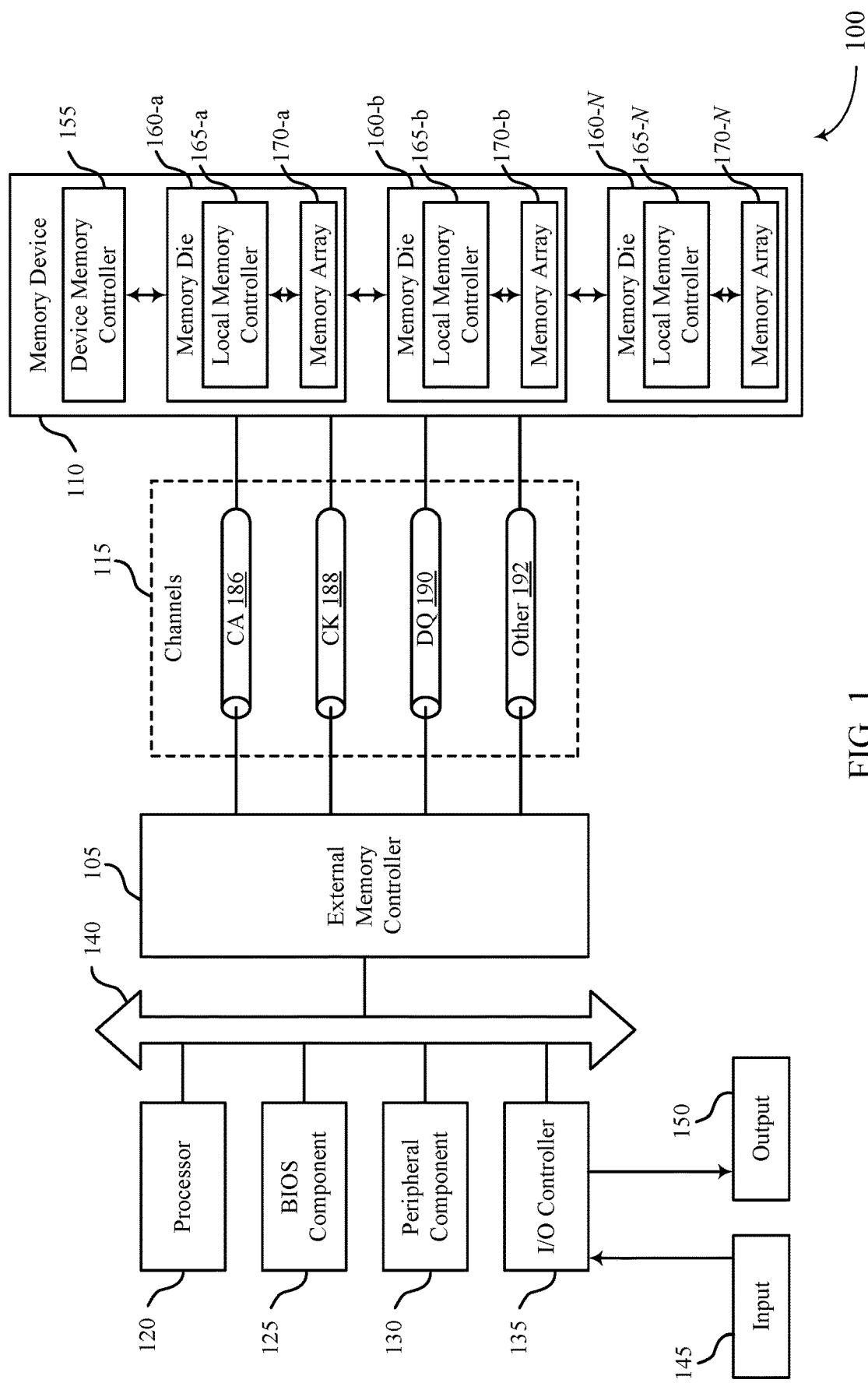
FIG. 1 illustrates an example of a system that supports configurable memory termination in accordance with examples as disclosed herein.

Features of the disclosure are initially described in the context of a system including a memory device with reference to FIG. 1. Features of the disclosure are further described in the context of systems with various configurations of selection components and termination components with reference to FIGS. 2-5. These and other features of the disclosure are further illustrated by and described with reference to an apparatus diagram and a flowchart that relate to configurable memory termination as described with references to FIGS. 6 and 7.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include portions of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, a vehicle, a vehicle controller, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose graphic processing unit (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel.

In some cases, a pin or pad of a terminal may be part of a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (e.g., including sixteen signal paths), and so forth. Signals communicated over the channels may use a double data rate (DDR) timing scheme. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110.

In some cases, the channels 115 may include one or more other channels 192 that may be dedicated to other purposes. These other channels 192 may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., a PAM3 signal or a PAM4 signal) may be a signal that is modulated using a modulation scheme that includes at least three levels to encode more than one bit of information per symbol. Multi-symbol modulation schemes and symbols may alternatively be referred to as non-binary, multi-bit, or higher-order modulation schemes and symbols.

In some cases, a memory system may include one or more memory devices 110, and may be referred to as a memory module or a memory assembly. In some examples, a memory system may refer to a single in-line memory module (SIMM), a dual in-line memory module (DIMM), or other type of module or assembly. A system may be configured such that a host device is in electronic communication with a set of memory systems over a common channel, such as a data channel. In some cases, components or circuitry of one memory system coupled with the common channel may cause degradation or attenuation of signaling associated with another memory system connected or coupled with the common channel. To reduce or eliminate such degradation or attenuation, a memory system in accordance with the present disclosure may include a selection component operable to selectively isolate or connect various components or circuitry of the memory system from the common channel, which may be responsive to signaling from the host device. In other words, memory systems in accordance with the present disclosure may include configurable termination (e.g., of or associated with a common channel), which may be configurable based on whether or not a particular memory system is being accessed or is to be available for accessing. By isolating or disconnecting circuitry of a memory system from one or more signal paths of such a channel, degradation or attenuation of signals that might otherwise be caused by input/output circuitry of or associated with the memory system, or related signal paths, may be reduced or eliminated.

Figure 2:
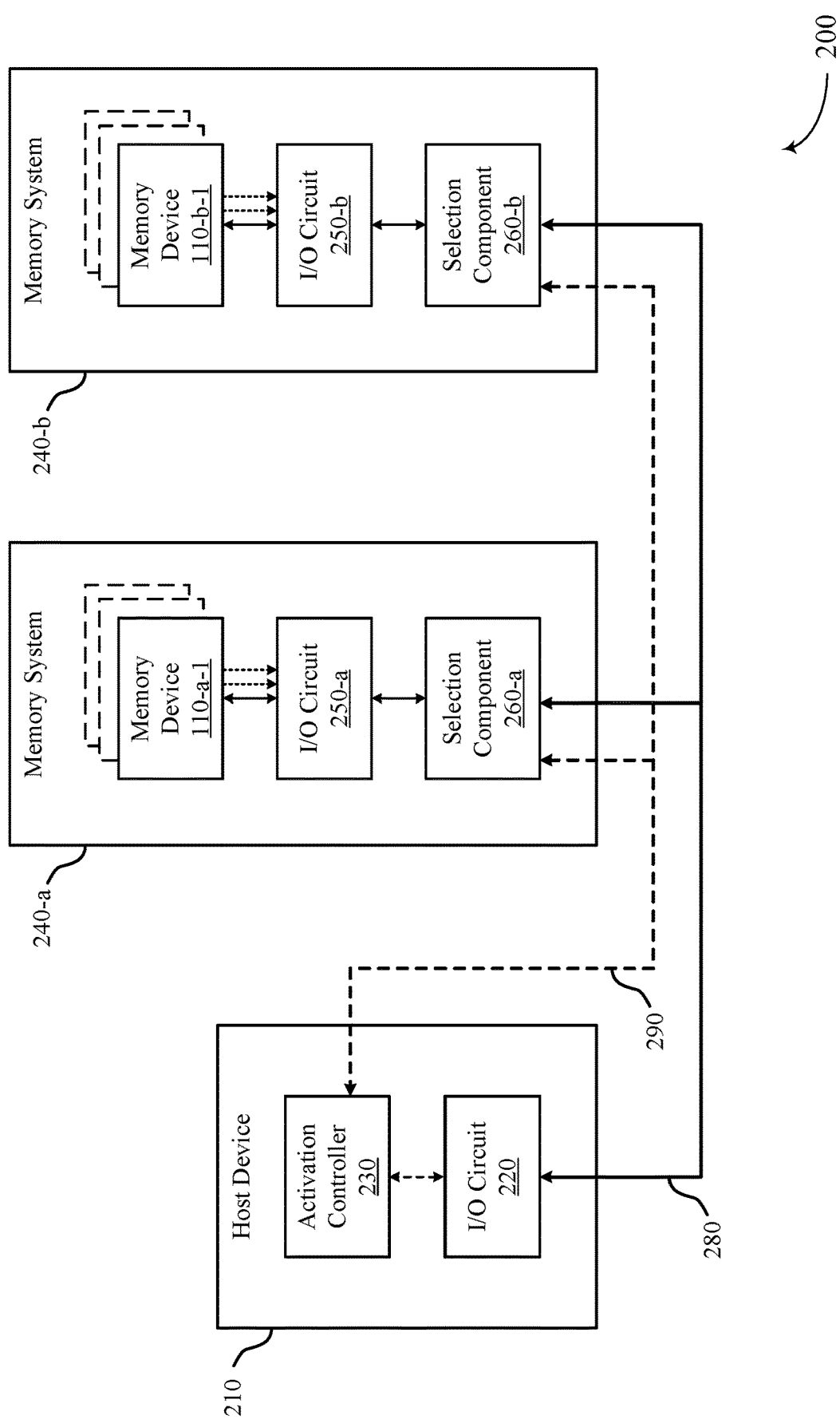
FIG. 2 illustrates an example of a system that supports configurable memory termination in accordance with examples as disclosed herein.

FIG. 2 illustrates an example of a system 200 in accordance with examples as disclosed herein. The system 200 includes a host device 210, a memory system 240-a, and a memory system 240-b. The host device 210, the memory system 240-a, and the memory system 240-b may be coupled or connected (e.g., electrically) with each other over a channel 280 (e.g., a common channel, a shared channel). In some examples, the channel 280 may be or include a data channel, such as a DQ channel. In some examples, the channel 280 may be illustrative of one or more signal paths, traces, or lanes, of a set of one or more channels for various types or categories of signaling between the host device 210, the memory system 240-a, and the memory system 240-b. For example, the channel 280 may be illustrative of a bus having 72 signal paths, or any other quantity of signal paths. Although the system 200 is illustrated as including two memory systems 240, a system in accordance with the present disclosure may include any quantity of memory systems 240.

In some examples, a memory system 240 may refer to a set of components that are physically distinct from a host device, such as a memory module or a memory assembly. For example, a memory system 240 may refer to a SIMM, a DIMM, or other type of module or assembly. In some examples, a memory system 240 may include pins, sockets, connectors, or other terminals that support an electrical connection with the channel 280, where such terminals may support physically separable connections, assemblies, or installations. In some examples, a memory system 240 may include electrical contacts that support the memory systems 240 being separately manufactured, and then installed permanently, semi-permanently, or temporarily. The memory systems 240 may be manufactured according to various form factors, and one memory system 240 of the system 200 may or may not have a different form factor of another memory system 240 of the system 200.

Each of the memory systems 240 may include one or more memory devices 110 and an I/O circuit 250 to support communications between the memory devices 110 and the channel 280. The memory devices 110 (e.g., memory devices 110-a, 110-b) may be examples of a memory device 110 described with reference to FIG. 1, such as a DRAM device. The I/O circuits 250 may include one or more modulators, one or more demodulators, or both, to support unidirectional or bidirectional communication (e.g., with the host device 210) over the channel 280, along with various other components or signal paths between the channel 280 and the memory devices 110. In some examples, an I/O circuit 250 of or associated with a respective memory system 240 may be coupled with a device memory controller 155 of each of the memory devices 110 corresponding to the respective memory system 240.

In examples where a memory system 240 includes two or more separate memory devices 110, such as two or more sets of independent memory chips connected to the same address and data bus, each such set may be referred to as a rank. In some examples, a particular rank may be activated by the corresponding rank's chip select (CS) signal, and in some examples other ranks of the memory system 240 may be deactivated. In some examples, an I/O circuit 250 may include selection or multiplexing circuitry configured for selecting a rank or otherwise routing access signals to a particular rank of the associated memory system 240.

The host device 210 may refer to a device that uses the memory systems 240 for data storage, or otherwise coordinates the use of the memory systems 240 for data storage. The host device 210 may include an I/O circuit 220 operable for communicating signaling over the channel 280. For example, the I/O circuit 220 may include one or more modulators, one or more demodulators, or both, to support unidirectional or bidirectional communication over the channel 280 (e.g., with the memory systems 240-a and 240-b), along with various other components or signal paths.

In some examples, the host device 210 may include pins, sockets, connectors, or other terminals that support an electrical connection with the channel 280. In some examples, the memory systems 240 may include mating connectors for direct physical or electrical coupling with the host device 210. In other examples, the host device 210 and the memory systems 240 may be physically or electrically coupled via an intervening component or assembly, such as a motherboard or other printed circuit board that includes signal paths of the channel 280 between the host device 210 and the memory systems 240.

In some cases, the host device 210 may perform access operations on one of the memory systems 240 where information is exchanged via signaling over the channel 280. For example, when the host device 210 is accessing the memory system 240-a, signaling may be transmitted by the host device 210 and received by the memory system 240-a (e.g., data signaling supporting a write operation, command signaling supporting read or write operations), or transmitted by the memory system 240-a and received by the host device 210 (e.g., data signaling supporting a read operation), or both. To support such signaling, the transmitting device may control the voltage of one or more signal paths of the channel 280 (e.g., as a voltage control authority of the signal path), and the receiving device may detect a corresponding voltage or other signal of the signal path. Based on such a detection, the receiving device may detect the information being conveyed by the transmitter.

In some examples of communication signaling between the host device 210 and the memory system 240-a, signal degradation or attenuation on the channel 280 may cause errors in the signals communicated between the host device 210 and the memory system 240-a. For example, for a given signaling, the receiving device may not detect the same information that was intended to be conveyed by the transmitting device. In a binary signaling example, in the presence of signal degradation or attenuation, the receiving device may detect a logic 1 when the transmitting device was attempting to signal a logic 0, or vice versa.

In some cases, signal degradation or attenuation on the channel 280 during communications between the host device 210 and the memory system 240-a may be associated with circuitry (e.g., signal paths, components) of the memory system 240-b that is electrically coupled or connected with the channel 280. For example, when the I/O circuit 250-b is connected with the channel 280 during such communication between the host device 210 and the memory system 240-a, components or signal paths of the I/O circuit 250-b may interact with or otherwise impair the signaling or voltage control of the transmitter (e.g., the voltage control authority). Examples of such interactions may include a voltage drop or other biasing across a signal path or termination, reflections or oscillating signal characteristics associated with a signal path or components, capacitance, or other impedance of the I/O circuit 250-b, and other effects. Interactions such as these may cause (e.g., from the perspective of the memory system 240-a, from the perspective of the host device 210) a signal level to change (e.g., decrease, increase), may cause a signal stability to change (e.g., may introduce an oscillatory component), may cause a signal timing to change (e.g., may introduce a signal delay or advance), or other disturbance or signal noise, which may impair the communication of signaling between the host device 210 and the memory system 240-a.

In some cases, where the memory system 240-a is connected more closely to the host device 210 than the memory system 240-b, the memory system 240-a may have a relatively impaired communication margin as compared with the memory system 240-b. For example, when the memory system 240-a is receiving signaling from the host device 210, the memory system 240-a may receive or interpret not only the base signal as transmitted or controlled by the host device 210, but also a reflection component as a result of interaction with the I/O circuit 250-b and intervening signal paths. In another example, when the host device 210 is receiving signaling from the memory system 240-a, the host device 210 may receive or interpret not only the base signal as transmitted or controlled by the memory system 240-*a*, but also a reflection component as a result of interaction with the I/O circuit 250-*b* and intervening signal paths. In such a configuration, the memory system 240-*b* may also receive or interpret not only a base signal as transmitted or controlled by the host device 210, but also a reflection signal component as a result of interaction with the I/O circuit 250-*a*. Likewise, the host device 210 may also receive or interpret not only a base signal as transmitted or controlled by the memory system 240-*b*, but also a reflection signal component as a result of interaction with the I/O circuit 250-*a*. In some cases, reflections associated with the I/O circuit 250-*a* (e.g., as perceived at the memory system 240-*b*, as perceived at the host device 210) may be lower or lesser than the reflections associated with the I/O circuit 250-*b* (e.g., as perceived at the memory system 240-*a*, as perceived at the host device 210). More generally, I/O circuitry or related signal paths of one memory system 240 coupled to a channel 280 may be associated with different (e.g., greater or lesser) signal degradation or attenuation than I/O circuitry or related signal paths of another memory system 240 coupled to the same channel 280.

In some circuitry, reflections may be related to a length of a signal path (e.g., a stub length), which may be related to a signal path length of an I/O circuit 250 or of a signal path between an I/O circuit 250 and the channel 280 (e.g., a sub length between a pin of the memory system 240 and some portion of the I/O circuit 250). For example, reflections may be relatively greater for relatively longer signal paths. In some examples, a signal path layout of a memory system 240 may result in reflection asymmetry from one signal path to another due to signal paths of the channel 280 being associated with different stub lengths in the memory system 240, which may further affect communication margins. More generally, reflections or other phenomena related to signal degradation or attenuation may be based on various characteristics of circuitry and signal paths of a system 200, which may be different with relation to one memory system 240 to another memory system 240, or may be different with relation to one signal path of a channel 280 to another signal path of the channel 280.

In some cases, the memory systems 240 may include an in-line resistance element between the channel 280 and the memory devices 110 (e.g., included in an I/O circuit 250, between an I/O circuit 250 and a channel 280) to mitigate some examples of signal degradation. For example, such a resistance element may be included to reduce or attenuate reflections that may be carried along the channel 280 (e.g., where a resistance element of the memory system 240-*b* may reduce reflections or other degradation as perceived at the memory system 240-*a*). However, although a passive resistance element may reduce some aspects of signal degradation or attenuation, a channel 280 may still experience various interactions associated with having multiple memory systems 240 connected with the same channel 280.

To mitigate interactions related to having multiple memory systems 240 connected with a same channel 280, each of the memory systems 240 may include a selection component 260 operable to selectively isolate a respective I/O circuit 250 from the channel 280 (e.g., one or more signal paths of the channel 280). For example, when the host device 210 is accessing the memory system 240-*a*, the selection component 260-*a* may be used to selectively connect or couple the I/O circuit 250-*a* with the channel 280 and the selection component 260-*b* may be used to selectively disconnect or isolate the I/O circuit 250-*b* from the channel 280. Such an disconnection or isolation of the I/O circuit 250-*b* may reduce or eliminate signal degradation or attenuation (e.g., as perceived or interpreted at the memory system 240-*a* or the host device 210), such as reflections, that may otherwise result if the I/O circuit 250-*b* were connected with the channel 280. Moreover, such a selective isolation may support aspects of balancing signal degradation or attenuation among respective signal paths of the channel 280. In some cases, such a selective isolation may enable a greater quantity of memory systems 240 to share a channel 280, such as systems or architectures that support more than two memory systems 240 (e.g., more than two DIMMs) that share a common channel or channel bus.

In some examples, the selection components 260 may be responsive to signaling from the host device 210 about which memory system 240 is being accessed by the host device 210. For example, the host device 210 may include an activation controller 230 which may understand or control which of the memory systems 240 are to be activated (e.g., available for access operations), and which of the memory systems 240 are to be deactivated (e.g., not used for access operations). The activation controller 230 may determine or identify that the memory system 240-*a* is to be accessed and the memory system 240-*b* is to be idled, and transmit relevant signaling to the memory system 240-*a* and the memory system 240-*b*. By isolating or idling some memory systems 240 (e.g., memory system 240-*b*), the signal communicated with another memory system 240 (e.g., memory system 240-*a*) may experience less interference. The host device 210 may transmit a first signal (e.g., an activation signal) to the memory system 240-*a* and a second signal (e.g., a deactivation signal) to the memory system 240-*b*. In some examples, the host device 210 may transmit a same signal to both the memory system 240-*a* and the memory system 240-*b* (e.g., a signal indicating that the memory system 240-*a* is being accessed), and the respective memory system 240 may interpret the same signal relative to its own operations (e.g., the memory system 240-*a* receiving the same signal and activating the selection component 260-*a* and the memory system 240-*b* receiving the same signal and deactivating the selection component 260-*b*). In some examples, such signaling may be carried from the activation controller 230 to the memory systems 240 over the channel 280 itself. In other examples, the system 200 may be configured with a control path 290 configured to convey activation/deactivation signaling to each of the memory systems 240, which may or may not be a signal path or signaling that is particularly dedicated to activation or deactivation of a selection component 260. In some examples, a control path 290 may be couple the same or similar components together as the channel 280 (e.g., common I/O circuitry). In such examples, the signaling rom the activation controller 230 to the memory systems 240 may be communicated over the control path 290. For example, a control path 290 may be a communication path connected with or between an I/O circuit 220, an I/O circuit 250-*a*, or an I/O circuit 250-*b*.

In some examples, the control path 290 may be a communication between an I/O circuit 220 of the host device 210 and one or more memory systems 240-*a* or 240-*b*. In some of these examples, the control path 290 may not be coupled with the I/O circuit 250 of a memory system 240. In some cases, the signaling from the activation controller 230 may be part of address/control signal group which is separate from data, for example, a data signal or channel (DQ) or data strobe (DQS). In some architectures, the DQ or the DQS signal or both are double the speed of an address/control group. The channel 280 and the control path 290 may be different channels of different signal groups. For instance, data signals (e.g., DQ or DQS) may be driven from the I/O circuits (e.g., DQ/DQS are driven from the I/O circuit 220 for a write operation and the I/O circuit 250 of the memory system 240 may drive signals for a read operation). Address/control signals, however, may be driven by I/O circuit 220 of the host device 210. In some cases, address/control signals may be half the speed of data, and thus components of the I/O circuits 220 and 250 may be different for the different signals in host device 210 and memory system 240 may be different for the different signal groups like data and address/control.

In examples where a system 200 includes a control path 290, or when a system conveys activation/deactivation signaling over the channel 280, each of the memory systems 240 may include a receiver, not shown, for receiving such signaling for selective connection or isolation by the respective selection component 260. In various examples, such a receiver may be a signal path operable to selectively activate a switch (e.g., a transistor, a multiplexer), or may be a component that demodulates or demultiplexes such a signal to be otherwise processed for selectively activating or deactivating a respective selection component 260.

Figure 3:
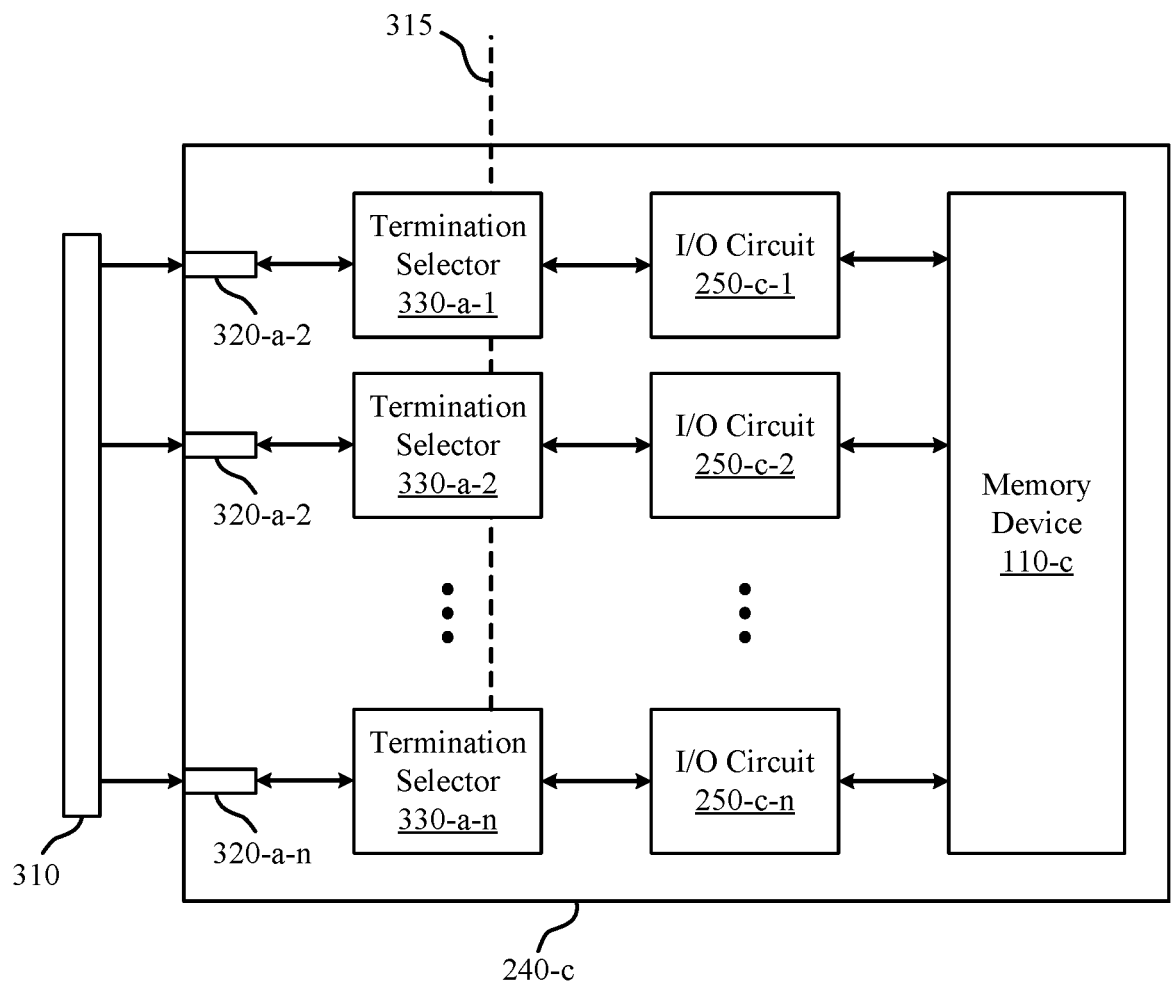
FIG. 3 illustrates an example of a memory system that supports configurable memory termination in accordance with examples as disclosed herein.

FIG. 3 illustrates an example of a memory system 240-c that supports configurable memory termination in accordance with examples as disclosed herein. The memory system 240-c includes a set of terminals 320-a (e.g., terminals 320-a-1 through 320-a-n) that may be configured for connection or coupling with a channel bus 310, which may be a bus associated with a channel 280 described with reference to FIG. 2. For example, each of the terminals 320 may be an electrical pin or other contact corresponding to a respective signal path of the channel bus 310. The memory system 240-c also includes a memory device 110-c connected or coupled with a set of I/O circuits 250-c (e.g., I/O circuits 250-c-1 through 250-c-n). Although a single memory device 110-c is shown, the memory system 240-c may include one or more memory devices 110-c in various examples. In the example of memory system 240-c, each of the I/O circuits 250-c may correspond to a respective one of the terminals 320-a. Although each of the I/O circuits 250-c is illustrated as a separate component, the I/O circuits 250 may collectively refer to I/O circuitry that is shared across signal paths corresponding to the channel bus 310, where such I/O circuitry may be common to one or more memory devices 110-c of the memory system 240-c.

The memory system 240-c also includes a corresponding set of termination selectors 330-a (e.g., termination selectors 330-a-1 through 330-a-n) operable to select a termination configuration of the memory system 240-c. For example, each of the termination selectors 330-a may illustrate or include a selection component operable to selectively isolate a respective I/O circuit 250-c from a respective signal paths of a channel 280 corresponding to the channel bus 310. In the example of memory system 240-c, such functionality may be provided by the termination selectors 330-a being operable to selectively isolate a respective I/O circuit 250-c from a respective terminal 320-a (e.g., disconnecting a respective I/O circuit 250-c from a respective terminal 320-a). In various examples, such selective isolation by the termination selectors 330-a may be based on or responsive to signaling from a host device connected or coupled with the channel bus 310, where such signaling may be carried via the channel bus 310 itself or via a control bus 315.

In various examples, each of the termination selectors 330-a may include one or more termination resistance elements. In some examples, such termination resistance elements may be located along signal paths between a respective terminal 320-a and a corresponding I/O circuit 250-c. Additionally or alternatively, such termination resistance elements may be located along signal paths between a respective terminal 320-a and another part of the memory system 240-c (e.g., not between the respective terminal 320-a and I/O circuit 250), such as a ground, a chassis ground, a reference voltage source, or some other alternative termination of the memory system 240-c or a system that includes the memory system 240-c. In various examples, termination resistance elements may include a resistor (e.g., a resistor element), a transistor, or some other portion of a respective signal path. In some examples, a resistance or impedance of a particular termination resistance element may be configurable based on signaling indicative of a type of access operation being performed over the channel bus 310 (e.g., by a host device coupled with the channel bus 310), such as whether a read operation is being performed over the channel bus 310 or a write operation is being performed over the channel bus 310. In some examples, such signaling indicative of a type of access operation being performed may be carried via the control bus 315.

According to various examples, a termination selector 330-a may select or otherwise configure a termination of the memory system 240-c (e.g., for a respective signal path of a channel 280 corresponding to the channel bus 310) based on signaling by or from a host device connected or coupled with the channel bus 310. Such signaling may, for example, indicate an access status of the memory system 240-c, such as whether the memory system 240-c is being accessed by the host device, is to be available for accessing by the host device, is not being accessed by the host device, or is to be in an idle state. Thus, the terminations of the channel bus 310 relative to the memory system 240-c may be configured (e.g., via the termination selectors 330-a) based on the operation of the memory system 240-c, or operation of any other memory systems 240 connected or coupled with the channel bus 310. In other words, the termination selectors 330-a may illustrate an example of components operable to modify, at the memory system 240-c, a connection between I/O circuits 250-c and one or more signal paths of the channel bus 310 based at least in part on receiving a signal from a host device.

In various examples, such configurable terminations may reduce or eliminate degradation or attenuation of signaling over the channel bus 310 that might otherwise be associated with the I/O circuits 250-c or other termination characteristics of the memory system 240-c. For example, where a portion of an I/O circuit 250-c, or a signal path between a termination selector 330-a and an I/O circuit 250-c, may be a source of reflections that may be passed back to the channel bus 310, a termination selector 330-a may be operable to reduce or eliminate such a source of reflections. In another example, where the memory system 240-c is configured such that respective signal paths corresponding to the channel bus 310 have different lengths (e.g., where signal paths of the I/O circuit 250-c-1 or between the I/O circuit 250-c-1 and the termination selector 330-a-1 have a different length than signal paths of the I/O circuit 250-c-n or between the I/O circuit 250-c-n and the termination selector 330-a-n), or have any other source of mismatched impedance, the termination selectors 330-a may be operable to reduce or eliminate such a mismatch of impedance, such as when impedance between respective terminals 320-a and termination selectors 330-a is relatively balanced. Thus, in accordance with various examples disclosed herein, the termination selectors 330-*a* may be operable to improve signaling over the channel bus 310, such as supporting a more direct point-to-point communication over the channel bus 310 between a transmitter and a receiver, reducing differences between positioning of memory systems 240 in a system (e.g., minimizing slot dependence of one memory system 240 relative to another within a system), improving voltage or other signaling margins over the channel bus 310, supporting increased rates or frequencies of data transfer over the channel bus, among other benefits.

Figure 4:
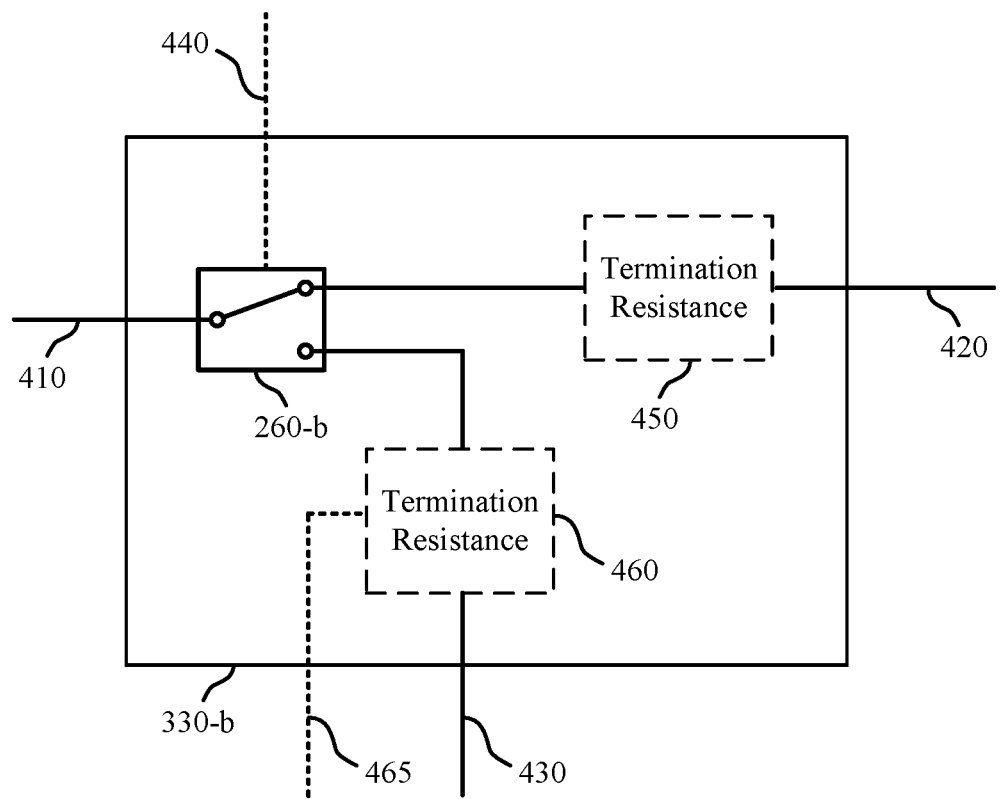
FIG. 4 illustrates an example of a termination selector that supports configurable memory device termination in accordance with examples as disclosed herein.

FIG. 4 illustrates an example of a termination selector 330-*b* that supports configurable memory termination in accordance with examples as disclosed herein. The termination selector 330-*b* may be an example of termination selectors 330-*a* described with reference to FIG. 3, and may be included in a memory system 240. In some examples, the termination selector 330-*b* may be implemented as an integrated circuit, which may be installed or assembled as a discrete component of a memory system 240 (e.g., as a discrete integrated circuit repeated for each signal path of a channel 280), or as part of such a component (e.g., as part an integrated circuit that collectively supports the described functions for multiple signal paths of a channel 280). In some examples, the termination selector 330-*b* may be part of an integrated circuit component that is separate from other components of a memory system 240, such as a component that is separate from I/O circuits 250 of a component that is separate from memory devices 110. In some examples, the boundary of the termination selector 330-*b* may be illustrative, such that the components of the termination selector 330-*b* are otherwise integrated in a memory system 240 (e.g., where the selection component 260-*b* and one or more of the termination resistance 450 or the termination resistance 460 are separate components mounted to a printed circuit board of a memory system 240, where a termination resistance 460 or a signal path 430 refer to an off-chip termination). In some cases, the termination resistance 460 may range between about 13.5 ohms and 16.5 ohms, 14 ohms and 16 ohms, 14.5 ohms and 15.5 ohms, or may be about 15 ohms. In some cases, the termination resistance 460 may range between about 8.5 ohms and 11.5 ohms, 9 ohms and 11 ohms, 9.5 ohms and 10.5 ohms or may be about 10 ohms. In some cases, the termination resistance 460 may be range between 10 ohms and 15 ohms and may be about 10 ohms, 10.5 ohms, 11 ohms, 11.5 ohms, 12 ohms, 12.5 ohms, 13 ohms, 13.5 ohms, 14 ohms, 14.5 ohms, or 15 ohms.

The termination selector 330-*b* may be connected or coupled with or between a signal path 410, a signal path 420, and a signal path 430. The signal path 410 may be operable for connection with a channel 280 or a channel bus 310 (e.g., connected with a terminal 320 of a memory system 240), which may support communications or signaling with a host device 210. The signal path 420 may be coupled with an I/O circuit 250, which may support communications or signaling with one or more memory devices 110 (e.g., to a DRAM memory device). The signal path 430 may be coupled with another signal path of a memory system 240, such as a ground, a chassis ground, a reference voltage source (e.g., having a voltage VDDQ), or some other alternative termination of the memory system 240 or a system that includes the memory system 240.

The termination selector 330-*b* may also include a selection component 260-*b*, which may be an example of a component that is operable to modify a termination of a memory system 240 (e.g., a termination of or associated with a channel 280 or channel bus 310). For example, the termination selector 330-*b* may be operable to connect the signal path 410 with one of the signal path 420 or the signal path 430. In some examples, the selection component 260-*b* may be operable to disconnect the signal path 410 from the signal path 420 when a memory system 240 that includes the termination selector 330-*b* is not being accessed, and instead connect the signal path 410 with the signal path 430 (e.g., connecting the signal path 410 with a termination circuit associated with the signal path 430). In some examples, the selection component 260-*b* may be operable to connect the signal path 410 with the signal path 420 when a memory system 240 that includes the termination selector 330-*b* is being accessed, or is otherwise to be available for accessing, and correspondingly disconnect the signal path 410 from the signal path 430. The selection component 260-*b* may be referred to as a 1:2 multiplexer or demultiplexer.

The termination selector 330-*b* may be operable based on signaling from a host device, which may be received over a signal path 440, which, in various examples, may be associated with a same channel 280 or channel bus as the signal path 410, or may be associated with a control bus 315. Although the selection component 260-*b* is illustrated as a single component, the selection component 260-*b* may include or refer to one or more subcomponents, such as multiple transistors in a switching network (e.g., a first transistor for connecting the signal path 410 with the signal path 420 and a second transistor for connecting the signal path 410 with the signal path 430).

In some examples, the termination selector 330-*b* may include a termination resistance 450 that illustrates a resistance or impedance for signaling along a path between the signal path 410 and the signal path 420. In some examples, the termination resistance 450 may include a passive resistor having a nominal resistance (e.g., a 15Ω resistor element, a discrete resistor, an on-board DIMM resistor). In other examples, the termination resistance 450 may refer to an active resistor such as a field effect transistor (FET) biased to impose a nominal resistance (e.g., a FET biased as a 15Ω resistance).

Although the termination resistance 450 is illustrated as being a component of the termination selector 330-*b*, in some examples, a termination resistance 450 may additionally or alternatively be included in another component of a memory system 240 that includes the termination selector 330-*b*, such as a component of an I/O circuit 250. Further, although the termination resistance 450 is illustrated as being a separate component, a termination resistance associated with the signal path 420 may refer to or otherwise include a resistance or impedance associated with the signal path 420, or a resistance or impedance associated with the selection component 260-*b* (e.g., a resistance or impedance of a transistor associated with the selection component 260-*b*). In some examples of a termination selector 330-*b*, a termination resistance 450 may be omitted (e.g., providing a direct electrical connection between the selection component 260-*b* and the signal path 420), which may be supported when an impedance of the selection component 260-*b* or the signal paths themselves is sufficient for various signaling or termination requirements.

In some examples, the termination selector 330-*b* may additionally or alternatively include a termination resistance 460 that illustrates a resistance or impedance for signaling along a path between the signal path 410 and the signal path 430. In some examples, the termination resistance 460 may include a passive resistor having a nominal resistance (e.g., a 15Ω resistor element, a discrete resistor, an on-board DIMM resistor). In other examples, the termination resistance 460 may refer to an active resistor such as a FET biased to impose a nominal resistance (e.g., a FET biased as a 15Ω resistance). In examples where the termination selector 330-b includes or is otherwise associated with both a termination resistance 450 and a termination resistance 460, the termination resistance 460 may have a different resistance or impedance than the termination resistance 450. In one example, a termination resistance 450 may have an impedance of 15Ω (e.g., associated with a resistor element or a FET), and a termination resistance 460 may have an impedance of 50Ω (e.g., associated with a resistor element or a FET). Accordingly, a termination selector 330-b may be operable for selecting between one signal path having a first resistance or impedance and another signal path having a second resistance or impedance that is different than the first.

Although the termination resistance 460 is illustrated as being a component of the termination selector 330-b, in some examples, a termination resistance 460 may additionally or alternatively be included in another component of a memory system 240 that includes the termination selector 330-b, such as a component of shared termination circuit. Further, although the termination resistance 460 is illustrated as being a separate component, a termination resistance associated with the signal path 430 may refer to or otherwise include a resistance or impedance associated with the signal path 430, or a resistance or impedance associated with the selection component 260-b (e.g., a resistance or impedance of a transistor associated with the selection component 260-b). In some examples of a termination selector 330-b, a termination resistance 460 may be omitted (e.g., providing a direct electrical connection between the selection component 260-b and the signal path 430), which may be supported when an of the selection component 260-b or the signal paths themselves is sufficient for various signaling or termination requirements.

In some examples, an impedance or resistance of the termination resistance 460 may be configurable. For example, the termination resistance 460 may have a relatively higher resistance or impedance in one mode of operation, and a relatively lower resistance or impedance in another mode of operation. In some examples, an impedance or resistance of the termination resistance 460 may be configurable based on signaling over a signal path 465, which may carry signaling from a host device 210 or a memory device 110. In one example, an impedance of the termination resistance 460 may be configurable based on a type of access operation being performed by a host device 210 (e.g., with a memory system 240 different than a memory device that includes the termination selector 330-b, which may also be connected with a channel 280 associated with the signal path 410). For example, the termination resistance 460 may have a first impedance when the signaling received over the signal path 465 indicates that the host device is performing a read operation, and the termination resistance 460 may have a second, different impedance when the signaling received over the signal path 465 indicates that the host device is performing a write operation.

Figure 5:
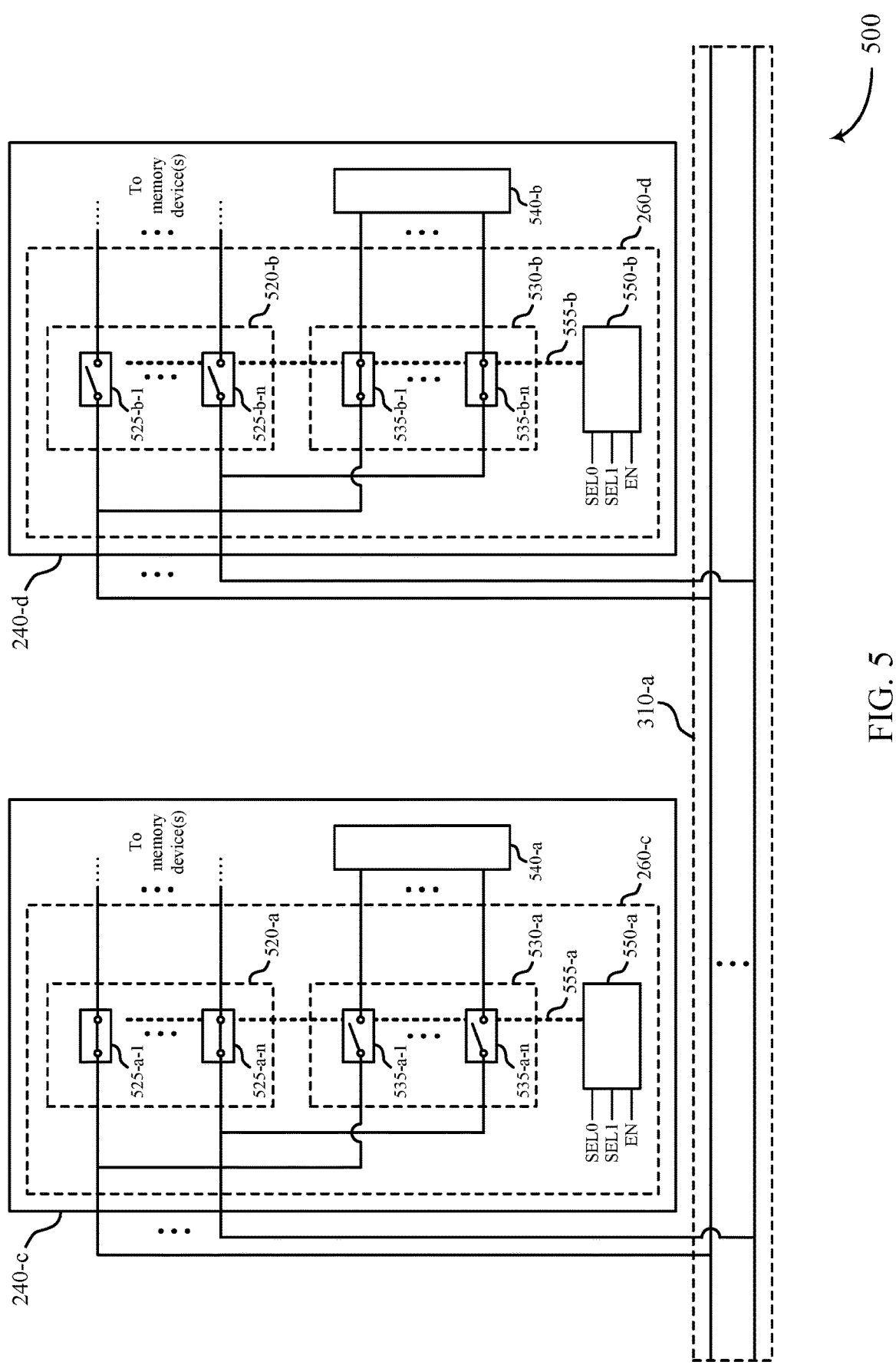
FIG. 5 illustrates an example of a system that supports configurable memory device termination in accordance with examples as disclosed herein.

FIG. 5 illustrates an example of a system 500 that supports configurable memory termination in accordance with examples as disclosed herein. The system 500 includes a first memory system 240-c and a second memory system 240-d that are connected or coupled with a channel bus 310-a. In the example of system 500, each of the memory systems 240 includes a first switching network 520 and a second switching network 530.

The respective first switching network 520 of a memory system 240 may be operable for selectively connecting or isolating the corresponding memory devices 110 (e.g., via an I/O circuit of the memory system 240, not shown) with the channel bus 310-a. Each of the first switching networks 520 may include a set of one or more switches 525, which may be operable based on signaling conveyed over a respective signal bus 555. In some examples, the switches 525 may be transistors.

The respective second switching network 530 of a memory system 240 may be operable for selectively connecting or isolating a corresponding termination circuit 540 with the channel bus 310-a. Each of the second switching networks 530 may include a set of one or more switches 535, which may be operable based on signaling conveyed over a respective signal bus 555. In some examples, the switches 535 may be transistors. In some examples in accordance with the present disclosure, a second switching network 530 or a termination circuit 540 may be omitted (e.g., for selectively isolating the memory devices 110 from the channel bus 310-a without connecting alternate circuitry).

In some examples, a respective first switching network 520 may receive a different signal than a respective second switching network 530. For example, a respective first switching network 520 may receive an "enable" signal when the respective second switching network 530 receives a "disable" signal, or vice versa. In some examples, such functionality may be supported by a signal inverter between the first switching network 520 and the second switching network 530 that can generate the two control signals based on a single state signal (e.g., corresponding to whether or not a respective memory system is to be available for accessing). In other examples, the different signals may be conveyed on different signal paths of a control bus 545. In another example, a respective first switching network 520 a respective second switching network 530 may receive a same signal, but the first switching network 520 and the second switching network 530 may be otherwise configured to provide the described functionality. For example, the switches 525 may be normally-open switches whereas the switches 535 may be normally-closed switches, or vice versa.

Each of the memory systems 240 may also include a receiver 550 operable to receive signaling from a host device for configuring various operations of the respective memory system 240. For example, a receiver 550 may be configured for receiving various selection or enabling signaling (e.g., SEL0, SEL1, EN), where such signaling may be specific to a particular memory system 240, or may be commonly signaled for any of a set of memory systems 240 connected with the channel bus 310-a. The receiver 550 may communicate signaling over a respective signal bus 555 for selectively enabling or disabling the switches 525 or the switches 535. For example, the receivers 550 may include control logic or circuitry configured to identify (e.g., based on signaling from a host device) whether a respective memory system 240 is or is not to be available for access operations over the channel bus 310-a, and operate a respective first switching network 520 and a respective second switching network 530 accordingly.

In some examples, a first switching network 520, or a combination of a first switching network 520, a second switching network 530, and a receiver 550, may be referred to as a selection component (e.g., a selection component 260) operable to selectively isolate memory devices 110, or an associated I/O circuit 250, from one or more signal paths of the channel bus 310-a based at least in part on receiving a signal from the host device. In some examples, a second switching network 530, or a combination of a first switching network 520, a second switching network 530, and a receiver 550, may be referred to as a selection component (e.g., a selection component 260) operable to selectively connect the one or more signal paths of the channel bus 310-*a* with the one or more termination resistance elements (e.g., a termination circuit 540), which may be operable during the selective isolation of the memory devices 110, or associated I/O circuit 250, from the one or more signal paths of the channel. In some examples, a first switching network 520, a second switching network 530, or a receiver 550, or a combination thereof, may be operable for modifying a connection between an input/output circuit of a memory system 240 (e.g., an I/O circuit 250 associated with the one or more memory devices 110 of the memory system 240) and one or more signal paths between the host device and the memory system (e.g., of the channel bus 310-*a*) based at least in part on receiving a signal from the host device.

The system 500 may illustrate an example where the first memory system 240-*c* is configured for being accessed over the channel bus 310-*a*, and where the second memory system 240-*d* is not configured for being accessed over the channel bus 310-*a*. Accordingly, the first switching network 520-*a* may be enabled, thereby allowing signaling between the channel bus 310-*a* and the memory devices of the first memory system 240-*c*. Correspondingly, the second switching network 530-*a* may be disabled, thereby isolating the termination circuit 540-*a* from the channel bus 310-*a*. Moreover, the first switching network 520-*b* may be disabled, thereby isolating the channel bus 310-*a* from the memory devices of the second memory system 240-*d*. Correspondingly, the second switching network 530-*b* may be enabled, thereby connecting the termination circuit 540-*b* with the channel bus 310-*a*. By connecting the termination circuit 540-*b* with the channel bus 310-*a*, signaling between the first memory system 240-*c* and the channel bus 310-*a* may be improved, because various sources of signal attenuation or degradation associated with the signal path between the first switching network 520-*b* and the memory devices of the second memory system 240-*d* may be reduced or eliminated.

Figure 6:
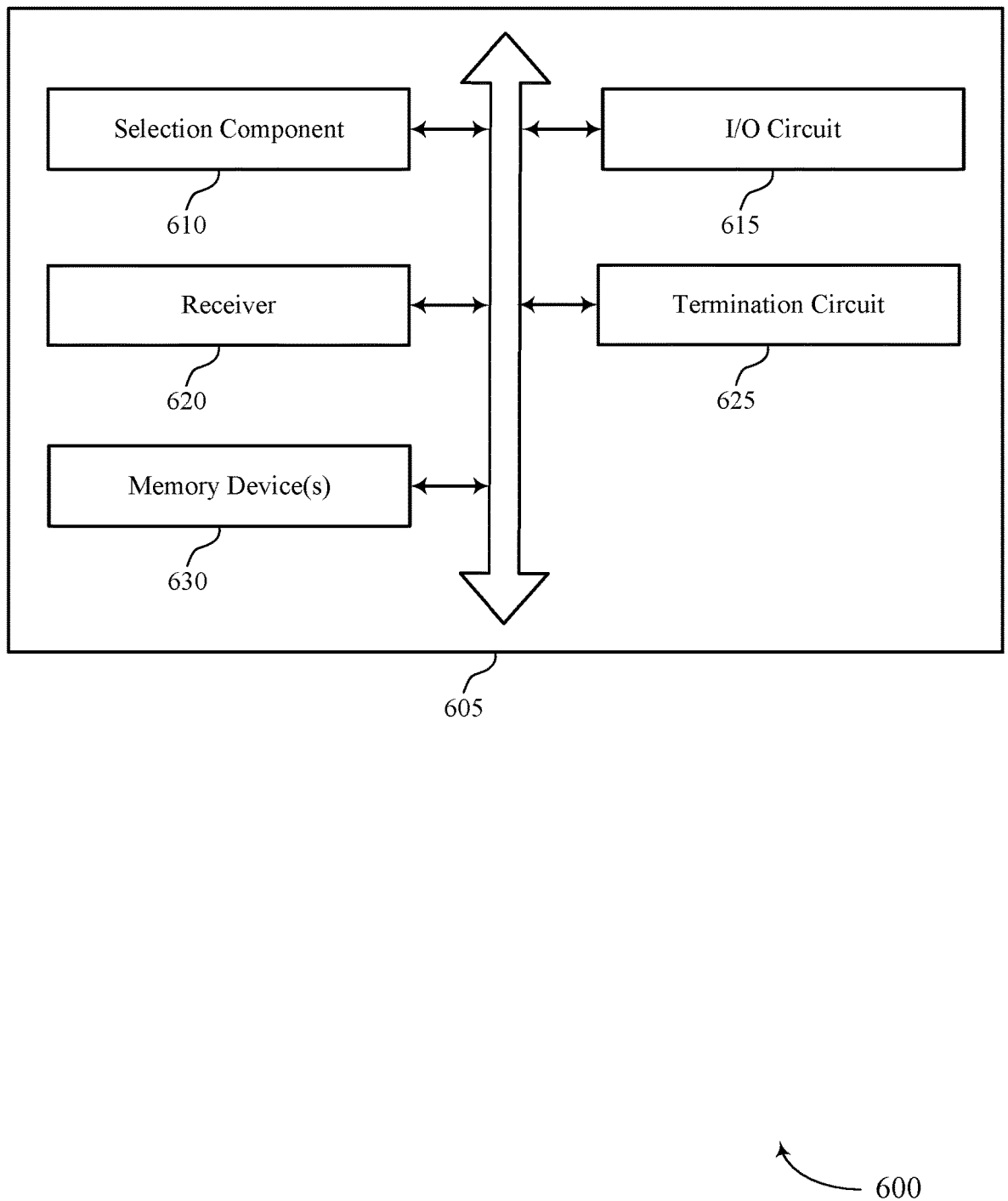
FIG. 6 shows a block diagram of a memory system that supports configurable memory termination in accordance with examples as disclosed herein.

FIG. 6 shows a block diagram 600 of a memory system 605 that supports configurable memory termination in accordance with examples as disclosed herein. The memory system 605 may be an example of aspects of a memory system as described with reference to FIGS. 2 through 5. The memory system 605 may include a selection component 610, an I/O circuit 615, a receiver 620, a termination circuit 625, and one or more memory devices 630. Each of these modules may communicate, directly or indirectly, with one another (e.g., via one or more buses).

The selection component 610 may modify, at the memory system 605, a connection between the I/O circuit 615 and one or more signal paths between a host device and the memory system 605 based on receiving a signal from the host device. In some examples, the selection component 610 may isolate the I/O circuit 615 from the one or more signal paths based on the signal indicating that the memory system 605 is not being accessed by the host device. In some examples, the selection component 610 may connect the I/O circuit 615 with the one or more signal paths based on the signal indicating that the memory system 605 is to be available for accessing by the host device. In some cases, the one or more signal paths are associated with a data channel.

The receiver 620 may receive a signal from a host device indicating whether the memory system 605 is being accessed by the host device. In some examples, the receiver 620 may receive the signal from the host device over a signal path (e.g., a control bus) different than the one or more signal paths (e.g., a data bus).

The termination circuit 625 may connect the one or more signal paths with the termination circuit 625 (e.g., of the memory system 605, associated with the memory system 605, of the selection component 610, associated with the selection component 610) based on indicating that the memory system 605 is not being accessed by the host device. In some examples, the termination circuit 625 may connect the one or more signal paths with one or more resistance elements (e.g., of the memory system 605, associated with the memory system 605, of the selection component 610, associated with the selection component 610). In some examples, the termination circuit 625 may receive a second signal from the host device indicating a type of access operation. In some examples, the termination circuit 625 may modify an impedance of the termination circuit 625 based on receiving the second signal from the host device.

Figure 7:
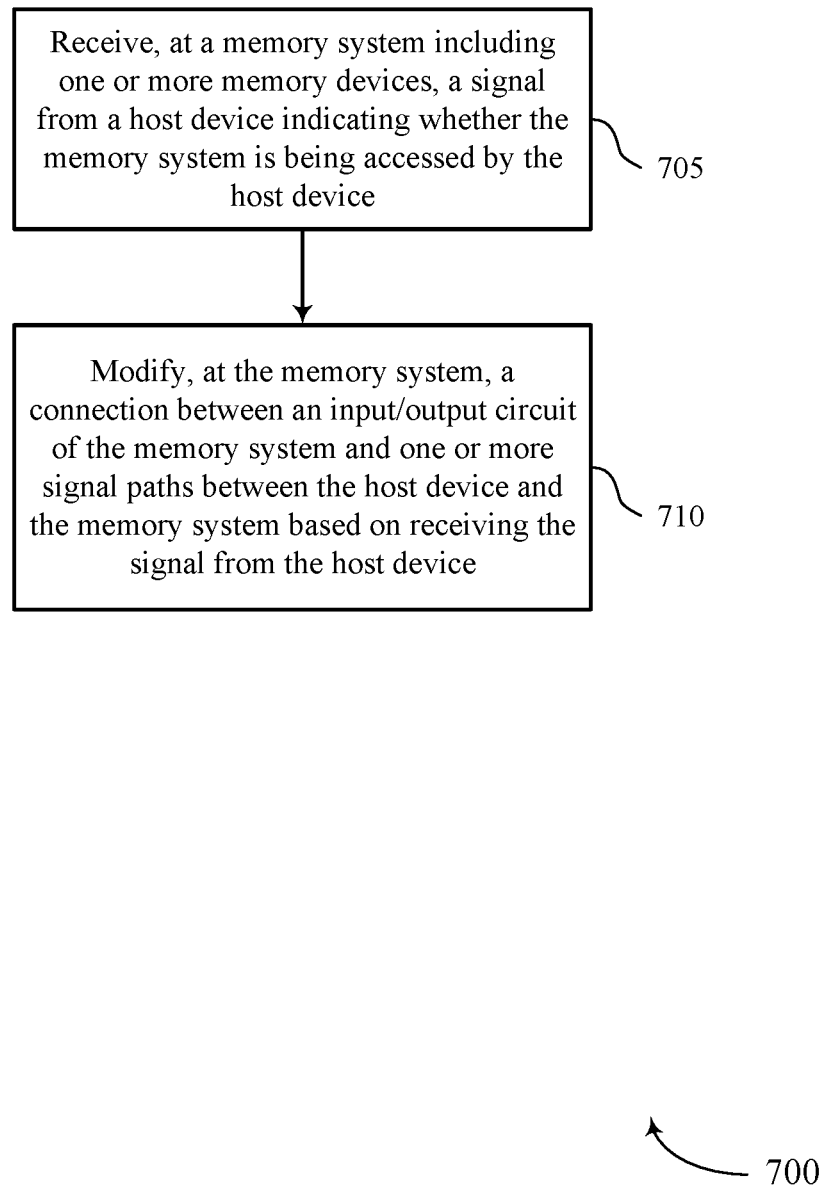
FIG. 7 shows a flowchart illustrating a method or methods that support configurable memory termination in accordance with examples as disclosed herein.

FIG. 7 shows a flowchart illustrating a method or methods 700 that supports configurable memory termination in accordance with examples as disclosed herein. The operations of method 700 may be implemented by a memory system or its components as described herein. For example, the operations of method 700 may be performed by a memory system as described with reference to FIG. 6. In some examples, a memory system may execute a set of instructions to control the functional elements of the memory system to perform the described functions. Additionally or alternatively, a memory system may perform aspects of the described functions using special-purpose hardware.

At 705, the memory system may receive, at a memory system including one or more memory devices, a signal from a host device indicating whether the memory system is being accessed by the host device. The operations of 705 may be performed according to the methods described herein. In some examples, aspects of the operations of 705 may be performed by a receiver as described with reference to FIG. 6.

At 710, the memory system may modify, at the memory system, a connection between an input/output circuit of the memory system and one or more signal paths between the host device and the memory system based on receiving the signal from the host device. The operations of 710 may be performed according to the methods described herein. In some examples, aspects of the operations of 710 may be performed by a selection component as described with reference to FIG. 6.

In some examples, an apparatus as described herein may perform a method or methods, such as the method 700. The apparatus may include features, circuitry, means, or instructions (e.g., a non-transitory computer-readable medium storing instructions executable by a processor) for receiving, at a memory system including one or more memory devices, a signal from a host device indicating whether the memory system is being accessed by the host device and modifying, at the memory system, a connection between an input/output circuit of the memory system and one or more signal paths between the host device and the memory system based on receiving the signal from the host device.

In some examples of the method 700 and the apparatus described herein, modifying the connection between the input/output circuit and the one or more signal paths may include operations, features, circuitry, means, or instructions for isolating the input/output circuit from the one or more signal paths based on the signal indicating that the memory system may be not being accessed by the host device. Some examples of the method 700 and the apparatus described herein may further include operations, features, circuitry, means, or instructions for connecting the one or more signal paths with a termination circuit (e.g., of the memory system, associated with the memory system, of a selection component, associated with a selection component) based on indicating that the memory system may be not being accessed by the host device.

In some examples of the method 700 and the apparatus described herein, connecting the one or more signal paths with the termination circuit may include operations, features, circuitry, means, or instructions for connecting the one or more signal paths with one or more resistance elements (e.g., of the memory system, associated with the memory system, of a selection component, associated with a selection component). Some examples of the method 700 and the apparatus described herein may further include operations, features, circuitry, means, or instructions for receiving a second signal from the host device indicating a type of access operation, and modifying an impedance of the termination circuit based on receiving the second signal from the host device.

Some examples of the method 700 and the apparatus described herein may further include operations, features, circuitry, means, or instructions for connecting the input/output circuit with the one or more signal paths based on the signal indicating that the memory system may be to be available for accessing by the host device. In some examples of the method 700 and the apparatus described herein, receiving the signal may include operations, features, circuitry, means, or instructions for receiving the signal from the host device over a signal path different than the one or more signal paths. In some examples of the method 700 and the apparatus described herein, the one or more signal paths may be associated with a data channel.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include one or more memory devices, an input/output circuit associated with the one or more memory devices and for communicating with a host device over a channel, and a selection component operable to selectively isolate the input/output circuit from one or more signal paths of the channel based on receiving a signal from the host device.

Some examples of the apparatus may include a receiver for receiving the signal from the host device over a signal path different than the one or more signal paths of the channel. Some examples of the apparatus may include one or more termination resistance elements, and the selection component may be operable to selectively connect the one or more signal paths of the channel with the one or more termination resistance elements, during the selective isolation of the input/output circuit from the one or more signal paths of the channel, based on the apparatus receiving the signal from the host device.

In some examples, each of the one or more termination resistance elements includes a transistor. In some examples, each of the one or more termination resistance elements includes a resistor element. In some examples, a resistance of each termination resistance element may be configurable based on signaling indicating a type of access operation being performed by the host device. Some examples of the apparatus may include one or more resistance elements connected between the selection component and the input/output circuit.

A system is described. The system may include a host device having a first input/output circuit for communicating over a channel, and a plurality of memory systems each having one or more memory devices and a second input/output circuit for communicating over the channel. The system may also include a plurality of selection components, each corresponding to a respective one of the plurality of memory systems, and each operable to selectively isolate the second input/output circuit of the respective one of the plurality of memory systems from the first input/output circuit based at least in part on signaling from the host device.

In some examples of the system, each of the plurality of memory systems may include a respective termination circuit, and each of the selection components may be operable to selectively connect the respective termination circuit of the corresponding memory system with the first input/output circuit based at least in part on the signaling from the host device.

In some examples of the system, an impedance of each of the respective termination circuit may be configurable based at least in part on a type of access operation being performed by the host device.

In some examples of the system, when the signaling from the host device indicates that a first memory system of the plurality of memory systems is being accessed, a first selection component of the plurality of selection components that corresponds to the first memory system may be operable to selectively connect the respective second input/output circuit of the first memory system with the first input/output circuit, and a second selection component of the plurality of selection components that corresponds to a second memory system of the plurality of memory systems may be operable to selectively isolate the respective second input/output circuit of the second memory system from the first input/output circuit.

In some examples of the system, the signaling from the host device may be communicated over a signal path that is different than one or more signal paths of the channel.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0 V) but that is not directly coupled with ground. Accordingly, the voltage of a virtual ground may temporarily fluctuate and return to approximately 0 V at steady state. A virtual ground may be implemented using various electronic circuit elements, such as a voltage divider consisting of operational amplifiers and resistors. Other implementations are also possible. "Virtual grounding" or "virtually grounded" means connected to approximately 0 V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

As used herein, the term "shorting" refers to a relationship between components in which a conductive path is established between the components via the activation of a single intermediary component between the two components in question. For example, a first component shorted to a second component may exchange signals with the second component when a switch between the two components is closed. Thus, shorting may be a dynamic operation that enables the flow of charge between components (or lines) that are in electronic communication.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a FET and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A memory system, comprising:
a set of one or more memory devices of the memory system;
one or more terminals of the memory system operable to couple with a channel between the memory system and a host device;
an input/output circuit of the memory system coupled with the set of one or more memory devices, the input/output circuit operable to communicate information between the channel and the set of one or more memory devices of the memory system; and
a selection component coupled between the one or more terminals of the memory system and the input/output circuit, the selection component operable to electrically disconnect the input/output circuit from the one or more terminals of the memory system based at least in part on receiving a signal from the host device.

2. The memory system of claim 1, further comprising:
a receiver for receiving the signal from the host device over a signal path different than one or more signal paths of the channel coupled with the one or more terminals of the memory system.

3. The memory system of claim 1, further comprising:
one or more termination resistance elements,
wherein the selection component is operable to electrically connect the one or more termination resistance elements with the one or more terminals of the memory system, during the electrical disconnection of the input/output circuit from the one or more terminals of the memory system, based at least in part on the memory system receiving the signal from the host device.

4. The memory system of claim 3, wherein each of the one or more termination resistance elements comprises a transistor.

5. The memory system of claim 3, wherein each of the one or more termination resistance elements comprises a resistor element.

6. The memory system of claim 3, wherein a resistance of each termination resistance element is configurable based at least in part on signaling indicating a type of access operation being performed by the host device.

7. The memory system of claim 1, further comprising:
one or more resistance elements connected between the selection component and the input/output circuit.

8. A method, comprising:
receiving, at a memory system comprising one or more memory devices and one or more terminals that are connected with one or more signal paths of a channel between the memory system and a host device, a signal from the host device indicating whether the memory system is being accessed by the host device; and
modifying, at the memory system based at least in part on receiving the signal from the host device, an electrical connection between an input/output circuit of the memory system and the one or more terminals of the memory system that are connected with the one or more signal paths of the channel between the host device and the memory system.

9. The method of claim 8, wherein modifying the electrical connection between the input/output circuit and the one or more terminals of the memory system comprises:
disconnecting the input/output circuit from the one or more terminals of the memory system based at least in part on the signal indicating that the memory system is not being accessed by the host device.

10. The method of claim 9, further comprising:
connecting the one or more terminals of the memory system with a termination circuit based at least in part on indicating that the memory system is not being accessed by the host device.

11. The method of claim 10, wherein connecting the one or more terminals of the memory system with the termination circuit comprises:
connecting the one or more terminals of the memory system with one or more resistance elements.

12. The method of claim 10, further comprising:
receiving a second signal from the host device indicating a type of access operation; and
modifying an impedance of the termination circuit based at least in part on receiving the second signal from the host device.

13. The method of claim 9, further comprising:
connecting the input/output circuit with the one or more terminals of the memory system based at least in part on the signal indicating that the memory system is to be available for accessing by the host device.

14. The method of claim 8, wherein receiving the signal comprises:
receiving the signal from the host device over a signal path different than the one or more signal paths.

15. The method of claim 8, wherein the one or more signal paths are associated with a data channel.

16. A system, comprising:
a host device having a first input/output circuit for communicating over a channel that is common to a plurality of memory systems;
the plurality of memory systems, each of the plurality of memory systems comprising one or more memory devices, one or more terminals coupled with the channel, and a respective second input/output circuit for communicating over the channel; and
a plurality of selection components, each of the plurality of selection components corresponding to a respective one of the plurality of memory systems and each operable to electrically disconnect the respective second input/output circuit of the respective one of the plurality of memory systems from the first input/output circuit of the host device based at least in part on signaling from the host device.

17. The system of claim 16, wherein each of the plurality of memory systems comprises a respective termination circuit, and wherein each of the selection components is operable to electrically connect the respective termination circuit of the corresponding memory system with the first input/output circuit based at least in part on the signaling from the host device.

18. The system of claim 17, wherein an impedance of each of the respective termination circuit is configurable based at least in part on a type of access operation being performed by the host device.

19. The system of claim 16, wherein, when the signaling from the host device indicates that a first memory system of the plurality of memory systems is being accessed:
- a first selection component of the plurality of selection components that corresponds to the first memory system is operable to electrically connect the respective second input/output circuit of the first memory system with the first input/output circuit; and
- a second selection component of the plurality of selection components that corresponds to a second memory system of the plurality of memory systems is operable to electrically disconnect the respective second input/output circuit of the second memory system from the first input/output circuit.

20. The system of claim 16, wherein the signaling from the host device is communicated over a signal path that is different than one or more signal paths of the channel.

* * * * *